United States Patent
Tenghamn et al.

(10) Patent No.: US 8,035,393 B2
(45) Date of Patent: Oct. 11, 2011

(54) FIBER OPTIC SYSTEM FOR ELECTROMAGNETIC SURVEYING

(75) Inventors: Stig Rune Lennart Tenghamn, Katy, TX (US); Steven J. Maas, Austin, TX (US)

(73) Assignee: PGS Geophysical AS, Lysaker (NO)

( * ) Notice: Subject to any disclaimer, the term of this patent is extended or adjusted under 35 U.S.C. 154(b) by 0 days.

(21) Appl. No.: 12/807,010

(22) Filed: Aug. 26, 2010

(65) Prior Publication Data

US 2011/0084696 A1  Apr. 14, 2011

Related U.S. Application Data

(62) Division of application No. 11/899,173, filed on Sep. 4, 2007, now abandoned.

(51) Int. Cl.
*G01V 3/15* (2006.01)
*G01V 3/00* (2006.01)
*G01R 31/00* (2006.01)

(52) U.S. Cl. .......... 324/365; 324/96; 324/347

(58) Field of Classification Search .......... 324/96, 324/97, 347, 348, 354, 357, 365
See application file for complete search history.

(56) References Cited

U.S. PATENT DOCUMENTS

| | | | |
|---|---|---|---|
| 4,329,580 A | 5/1982 | Riley et al. | |
| 4,376,248 A | 3/1983 | Giallorenzi et al. | |
| 4,524,322 A | 6/1985 | Bobb | |
| 4,600,885 A | 7/1986 | Koo et al. | |
| 4,653,915 A | 3/1987 | Frigo et al. | |
| 4,881,813 A | 11/1989 | Koo et al. | |
| 4,889,986 A | 12/1989 | Kersey et al. | |
| 5,053,693 A | 10/1991 | Bohnert et al. | |
| 5,171,981 A | 12/1992 | Wood | |
| 5,185,675 A * | 2/1993 | Banks | 398/170 |
| 5,243,403 A | 9/1993 | Koo et al. | |
| 5,305,075 A | 4/1994 | Bucholtz et al. | |
| 5,396,166 A | 3/1995 | Vohra et al. | |
| 5,491,335 A | 2/1996 | Bucholtz et al. | |
| 5,986,784 A | 11/1999 | Kersey et al. | |
| 6,081,633 A | 6/2000 | Kersey et al. | |
| 6,236,211 B1 | 5/2001 | Wynn | |
| 6,285,806 B1 | 9/2001 | Kersey et al. | |
| 6,314,056 B1 | 11/2001 | Bunn et al. | |
| 6,346,985 B1 | 2/2002 | Hall | |
| 6,351,128 B1 | 2/2002 | Johnston | |
| 6,522,797 B1 | 2/2003 | Siems et al. | |
| 6,850,461 B2 | 2/2005 | Maas et al. | |

(Continued)

FOREIGN PATENT DOCUMENTS

EP  0664460  7/1994

(Continued)

OTHER PUBLICATIONS

Dec. 3,2008, PCT International Search Report.

(Continued)

*Primary Examiner* — Kenneth J Whittington

(57) ABSTRACT

An electromagnetic survey sensing device includes at least two electrodes disposed at spaced apart locations. An electrical to optical converter is electrically coupled to the at least two electrodes. The converter is configured to change a property of light from a source in response to voltage imparted across the at least two electrodes. The device includes an optical fiber optically coupled to an output of the electrical to optical converter, the optical fiber in optical communication with a detector.

4 Claims, 7 Drawing Sheets

U.S. PATENT DOCUMENTS

| | | |
|---|---|---|
| 6,914,433 B2 | 7/2005 | Wright et al. |
| 2003/0198447 A1 | 10/2003 | Kim et al. |
| 2004/0232917 A1 | 11/2004 | Wright et al. |
| 2006/0236777 A1 | 10/2006 | Chambers et al. |
| 2006/0238200 A1 | 10/2006 | Iohnstad |
| 2007/0156320 A1 | 7/2007 | Breed et al. |

FOREIGN PATENT DOCUMENTS

| | | |
|---|---|---|
| WO | WO 97/09627 | 3/1997 |

OTHER PUBLICATIONS

Jan. 5, 2009, United Kingdom Search Report.

\* cited by examiner

FIBER OPTIC SYSTEM FOR ELECTROMAGNETIC SURVEYING

CROSS-REFERENCE TO RELATED APPLICATIONS

This application is a divisional application and claims the benefit under 35 U.S.C. §121 of U.S. patent application Ser. No. 11/899,173, filed Sep. 4, 2007 now abandoned, which is herein incorporated by reference.

STATEMENT REGARDING FEDERALLY SPONSORED RESEARCH OR DEVELOPMENT

Not applicable.

BACKGROUND OF THE INVENTION

The invention relates generally to the field of electromagnetic surveying of the Earth's subsurface. More specifically, the invention relates to electromagnetic survey systems including optical output sensors to reduce effects of electromagnetic noise on signals measured by the system.

Electromagnetic geophysical surveying of the Earth's subsurface includes "controlled source" and "natural source" electromagnetic surveying. Controlled source electromagnetic surveying includes imparting an electric field or a magnetic field into subsurface Earth formations, such formations being below the sea floor in marine surveys, and measuring electric field amplitude and/or amplitude of magnetic fields induced in response to the imparted field. Such measurements are performed by measuring voltage differences induced between spaced apart electrodes, induced in antennas and/or interrogating magnetometers disposed at the Earth's surface, or near or above the sea floor. The electric and/or magnetic fields from which the above measurements are made are induced in response to the electric field and/or magnetic field imparted into the Earth's subsurface, as stated above, and inferences about the spatial distribution of electrical conductivity of the Earth's subsurface are made from recordings of the induced electric and/or magnetic field measurements.

Natural source electromagnetic surveying includes deploying multi-component ocean bottom receiver stations and by taking the ratio of perpendicular field components, one can eliminate the need to know characteristics of the natural source.

Controlled source electromagnetic surveying known in the art includes imparting alternating electric current into the subsurface formations. The alternating current has one or more selected frequencies. Such surveying is known as frequency domain controlled source electromagnetic (f-CSEM) surveying. Another technique for electromagnetic surveying of subsurface Earth formations known in the art is transient controlled source electromagnetic surveying (t-CSEM). In t-CSEM, electric current is imparted into the Earth at the Earth's surface (or sea floor), in a manner similar to f-CSEM. The electric current may be direct current (DC). At a selected time, the electric current is switched off, switched on, or has its polarity changed, and induced voltages and/or magnetic fields are measured, typically with respect to time over a selected time interval, at the Earth's surface or water surface. Alternative switching techniques are possible. Structure of the subsurface is inferred by the time distribution of the induced voltages and/or magnetic fields. For example, U.S. Patent Application Publication No. 2004/232917 and U.S. Pat. No. 6,914,433 Detection of subsurface resistivity contrasts with application to location of fluids (Wright, et al) describes a method of mapping subsurface resistivity contrasts by making multichannel transient electromagnetic (MTEM) measurements on or near the Earth's surface using at least one source, receiving means for measuring the system response and at least one receiver for measuring the resultant earth response. All signals from each source-receiver pair are processed to recover the corresponding electromagnetic impulse response of the earth and such impulse responses, or any transformation of such impulse responses, are displayed to create a subsurface representation of resistivity contrasts. The system and method enable subsurface fluid deposits to be located and identified and the movement of such fluids to be monitored.

The above methods for f-CSEM and t-CSEM have been adapted for use in marine environments. Cable based sensors have been devised for detecting electric and/or magnetic field signals resulting from imparting electric and/or magnetic fields into formations below the bottom of a body of water. See, for example, U.S. Patent Application Publication No. 2006/0238200 filed by Johnstad. The amplitude of electric field signals detected by electrodes on cables such as described in the Johnstad publication may be on the order of fractions of a nanovolt. Accordingly, a particular consideration in the design and implementation of electromagnetic survey receiver systems is reducing the amount of noise that may be induced in the signals detected by the various sensing elements in the receiver system. One example of such noise reduction is to include batteries at each of a plurality of receiver system stations where signal amplification devices may be located. By eliminating the need to transmit operating power along a cable associated with the receiver system, induced noise may be reduced. Battery power does not eliminate induced noise resulting from electrical signal telemetry in cable type systems such as shown in the Johnstad publication, however, because electric current carrying such signals, representative of the voltages and/or magnetic field amplitudes measured, may induce noise in the measured signals.

There is a continuing need for electromagnetic survey devices that reduce noise induced in the measured signals caused by electric power and signal transmission along receiver cables.

SUMMARY OF THE INVENTION

An electromagnetic survey sensing device according to one aspect of the invention includes at least two electrodes disposed at spaced apart locations. An electrical to optical converter is electrically coupled to the at least two electrodes. The converter is configured to change a property of light from a source in response to voltage imparted across the at least two electrodes. The device includes an optical fiber optically coupled to an output of the electrical to optical converter, the optical fiber in optical communication with a detector.

An electromagnetic survey system according to another aspect of the invention includes a receiver cable having an optical fiber associated therewith and coupled at one end to a recording device and at another end to at least one electrical to optical converter. The recording device includes a light source and a photodetector therein in optical communication with the associated fiber. At least two electrodes are disposed at spaced apart locations along the receiver cable. The electrical to optical converter is electrically coupled to the at least two electrodes. The converter is configured to change a property of light from the source in response to voltage imparted across the at least two electrodes. The optical fiber is optically coupled to an output of the electrical to optical converter. The optical fiber is in optical communication with the detector in the recording device.

A method for sensing an electromagnetic field according to another aspect of the invention includes exposing an electric dipole antenna to the electromagnetic field. Voltage imparted to the antenna is conducted to an electrical device that changes a property of light imparted thereto in response to the voltage. A property of light conducted from a light source to the device and from the device to a photodetector along an optical fiber is varied, so that a signal corresponding to the voltage is optically communicated to the photodetector.

An electromagnetic survey system according to another aspect of the invention includes a survey vessel configured to tow a receiver cable through a body of water. The system includes a receiver cable having an optical fiber associated therewith and coupled at one end to a recording device on the vessel and at another end to a plurality of optical magnetic field sensors disposed at spaced apart positions along the cable. The sensors are each configured to change a property of light from source associated with the recording device. A signal detector is associated with the recording device and is configured to convert the changed property of light into a signal corresponding to a property of a magnetic field proximate each sensor.

A method for electromagnetic surveying of formations in the Earth's subsurface includes imparting an electromagnetic field into the formations. A magnetostrictive material is exposed to an electromagnetic field produced in response to the imparted electromagnetic field. A change in dimension of the magnetostrictive material caused by the responsively produced field is transferred to an optical fiber. The transferring causes a change in a property of light conducted from a light source to a photodetector along the optical fiber, so that a signal corresponding to the responsively produced electromagnetic field is optically communicated to the photodetector.

Other aspects and advantages of the invention will be apparent from the following description and the appended claims.

DETAILED DESCRIPTION

Figure 1A:
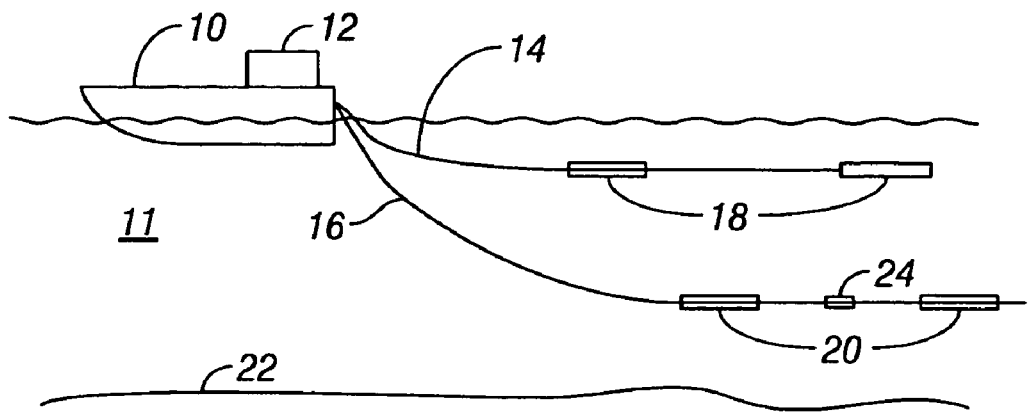
FIG. 1A shows an example marine electromagnetic survey system having a towed receiver cable.

An example electromagnetic survey system is shown schematically in FIG. 1A. The system shown in FIG. 1A is intended for marine use, however it will be appreciated by those skilled in the art that the invention is equally applicable to land-based electromagnetic surveys. A survey vessel 10 moves along the surface of a body of water 11 such as a lake or the ocean. The vessel 10 may include equipment, shown generally at 12 and referred to for convenience as a "recording system" that includes devices (none shown separately) for applying electric current to a source cable 14 towed by the vessel, for navigating the vessel and for recording signals detected by one or more sensors on a receiver cable 16.

The source cable 14 in the present example includes two source electrodes 18 disposed at spaced apart positions along the source cable 14. At selected times the equipment (not shown separately) in the recording system 12 conducts electric current across the source electrodes 18. Such electric current produces an electromagnetic field that propagates through the water 11 and into the formations below the water bottom 22. The particular type of current conducted across the source electrodes 18 may be single- or multi-frequency alternating current, or various forms of switched direct current, such that either or both transient and frequency domain controlled source electromagnetic surveying may be performed. It should also be understood that the arrangement of source electrodes 18 shown in FIG. 1A, referred to as a horizontal electric dipole transmitter antenna, is not the only type of electromagnetic transmitter that may be used with the invention. The source cable 14 could also tow, in addition to or in substitution of the horizontal electric dipole transmitter antenna shown in FIG. 1A, any one or more of a vertical electric dipole antenna, and horizontal or vertical magnetic dipole antenna. Accordingly, the source antenna configuration shown in FIG. 1A is not intended to limit the scope of the invention.

In the example shown in FIG. 1A, the vessel 10 also tows a receiver cable 16. The receiver cable 16 includes at least one pair of electrodes 20 disposed at spaced apart positions along the receiver cable 16. An electric field resulting from interaction of the induced electromagnetic field in the formations below the water bottom 22 induces voltages across the at least one pair of electrodes 20. In the present example, the pair of electrodes 20 may be associated with an electrical to optical converter 24 disposed at a selected position along the receiver cable 16, typically, but not necessarily between the electrodes 20. The electrical to optical converter 24 generates an optical signal that is related to the voltage induced across the electrodes 20 in response to the electromagnetic field imparted by the transmitter antenna (source electrodes 18). The optical signal is transmitted along an optical fiber (see 27 in FIG. 2A) associated with the receiver cable 16 to the recording unit 12, or as will be explained below with reference to FIG. 1B to a recording device.

Figure 1B:
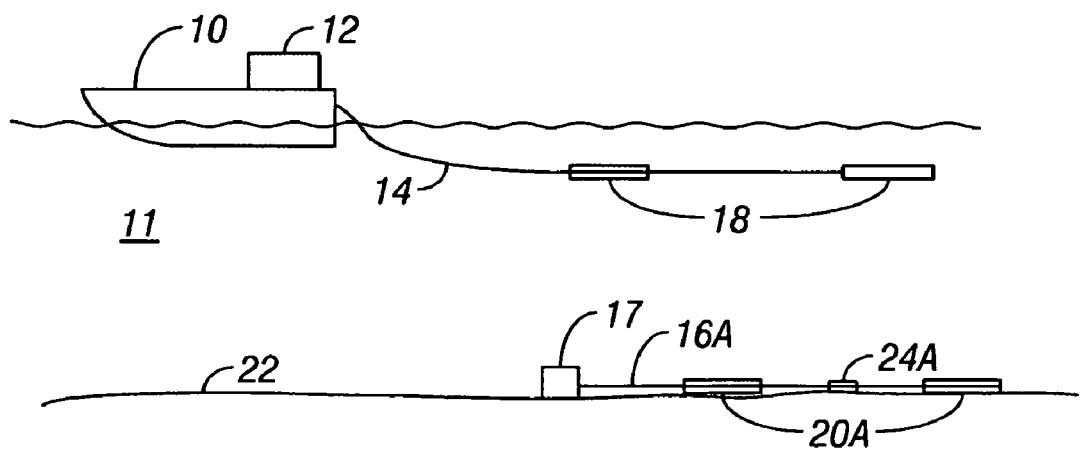
FIG. 1B shows an example marine electromagnetic survey system including an ocean bottom receiver cable.

FIG. 1B shows an arrangement similar to that of FIG. 1A, however, the receiver cable 16A is deployed on the water bottom 22. The receiver cable 16A in FIG. 1B may include at least one pair of electrodes 20A and an electrical to optical converter 24A associated therewith similar to those shown in FIG. 1A. The receiver cable 16A in FIG. 1B may have a recording device 17 associated therewith to record signals produced by the electrical to optical converter 24A and transmitted along an optical fiber (see FIG. 2A) from the converter 24A to the recording device 17. During acquisition using a receiver cable on the water bottom such as shown in FIG. 1A, there is typically no direct electrical or other type of connection between the receiver cable 16A and the recording system 12 on the vessel 10, thus it is convenient to provide a recording device 17 associated with the receiver cable 16A. Other than the manner of deployment of the receiver cable 16A, acquisition of electromagnetic signals may be similar to that explained above with reference to FIG. 1A.

Figure 2A:
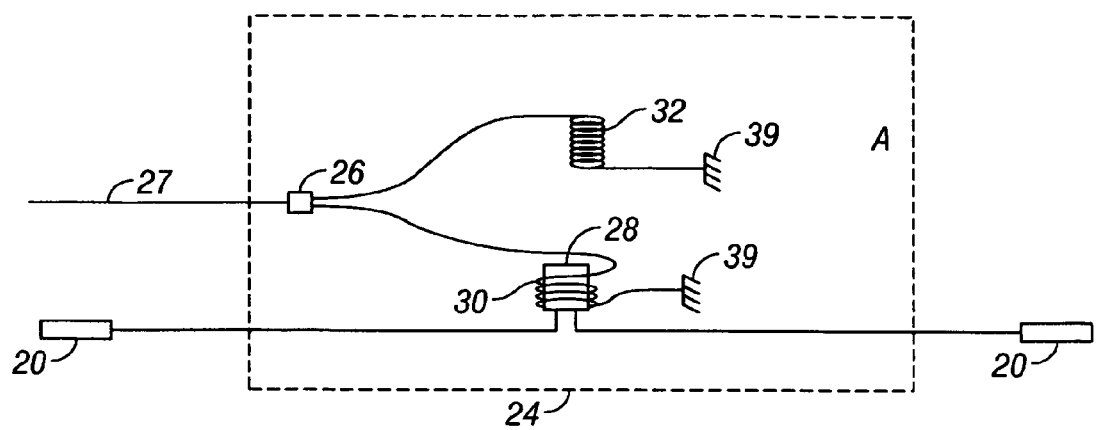
FIG. 2A shows one example electrical to optical converter that can be used with the systems shown in FIG. 1A and FIG. 1B.

An example of an electrical to optical converter 24 is shown in more detail in FIG. 2A. The electrical to optical converter 24 may include a piezoelectric element or crystal 28 that is electrically coupled to each of the electrodes 20. When the piezoelectric element 28 is so coupled to the electrodes 20, any voltage imparted across the pair of electrodes 20 will be conducted to the piezoelectric element 28. The piezoelectric element 28 will change shape to an extent corresponding to the voltage imparted across the electrodes 20. The piezoelectric element 28 may be in a convenient shape such as a cylinder that is configured to change diameter in response to the imparted voltage. The piezoelectric element 28 may be made from piezoelectric materials having high charge constants and high electro-mechanical coupling coefficients, such as lead zirconate titanate ("PZT"), lead magnesium niobate-lead titanate ("PMN-PT") and lead zirconate niobate-lead titanate ("PZN-PT").

An optical interferometer, which in the present example may include an optical coupling 26, a sensing fiber 30 and a reference fiber 32 coupled to output terminals of the optical coupling 26 may be arranged as shown in FIG. 2A. The sensing fiber 30 may be wound around the piezoelectric element 28 such that change in dimensions of the piezoelectric element 28, related to the voltage across the electrodes 20, will cause a corresponding change in the length of the sensing fiber 30. The reference fiber 32 may be provided such that changes in ambient conditions (e.g., temperature, pressure) will substantially equally affect both the sensing fiber 30 and the reference fiber 32. Each of the fibers 32, 30 may be terminated at an end opposite the optical coupling 26 by a mirror 39. The combination of optical elements shown in FIG. 2A may result in a phase shift in light passing through the sensing fiber 30, which when combined with light passing through the reference fiber 32 may produce an optical phase shift in the first optical coupling 26. The phase information may be conducted along an optical fiber 27 to the detection equipment (e.g. in the recording device 17 in FIG. 1B or in the recording system 12 in FIG. 1A) where the optical phase can be demodulated to reconstruct a signal corresponding to the imparted voltage with respect to time.

Figure 2B:
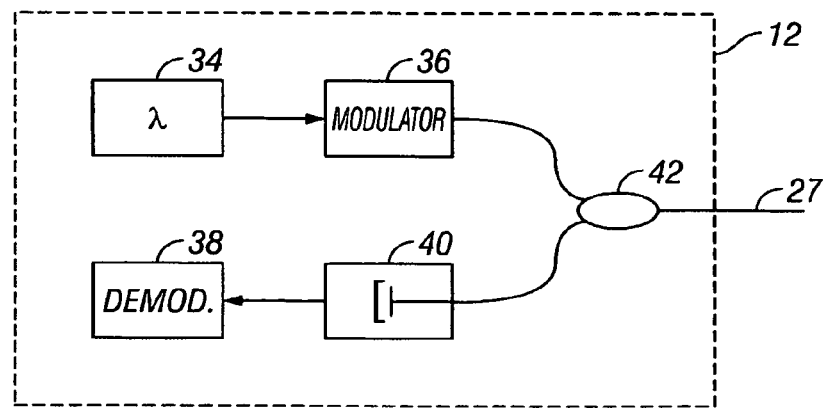
FIG. 2B shows light source and signal detection components of a recording system as in FIG. 1 that may be used with various examples of a system according to the invention.

An example of a light source and detection devices used in association with the recording unit (12 in FIG. 1A) or the recording device (17 in FIG. 1B) will new be explained with reference to FIG. 2B. In FIG. 2B, a light source 34 such as a laser diode may provide light at one or more wavelengths to the optical fiber 27 associated with the receiver cable (e.g., 16 in FIG. 1A). The light source 34 may be disposed in the recording system 12, if a towed receiver cable is used, or may be disposed in the recording device (17 in FIG. 1B) if the receiver cable (e.g., 16A in FIG. 1B) is disposed on the water bottom. The output of the light source 34 may pass through a modulator 36 to cause the light to be modulated, for example, to be pulsed at one or more selected frequencies. Output of the modulator 36 may be conducted to an optical coupling 42, one output of which is coupled to the optical fiber 27. A return tap on the optical coupling 42 may be coupled to a photodetector 40, which converts the returning light into an electrical signal corresponding to the amplitude of the light. Output of the photodetector 40 may be coupled to a demodulator 38 to recover the signals from the electrical to optical converter (e.g., 24 in FIG. 2A)

The general principle of the electrical to optical converter (24 in FIG. 2A) is to convert a voltage imparted across the electrodes (20 in FIG. 2A) to a corresponding change in properties of light from the source (34 in FIG. 2B). The change in properties of the light caused by the converter is such that a signal corresponding to the imparted voltage may be optically communicated to the recording system or the recording device without the need for electrical power to be transmitted along the receiver cable either as operating power or as signal telemetry. One type of change in properties of the light from the source is to cause a phase shift in the light. In such examples, the phase shift is related to the length of an optical path along the sensing fiber and/or optical components associated with the sensing fiber. The electrical to optical converter elements shown in FIG. 2A, for example cause a change in length of the optical path through the sensing fiber (30 in FIG. 2A) by changing the fiber length corresponding to change in diameter of the piezoelectric element (28 in FIG. 2A) as explained above.

Other examples of electrical to optical converters that can change the length of an optical path in response to a voltage imparted across the electrodes (20 in FIG. 2A) will now be explained with reference to FIGS. 3 through 6.

Figure 3:
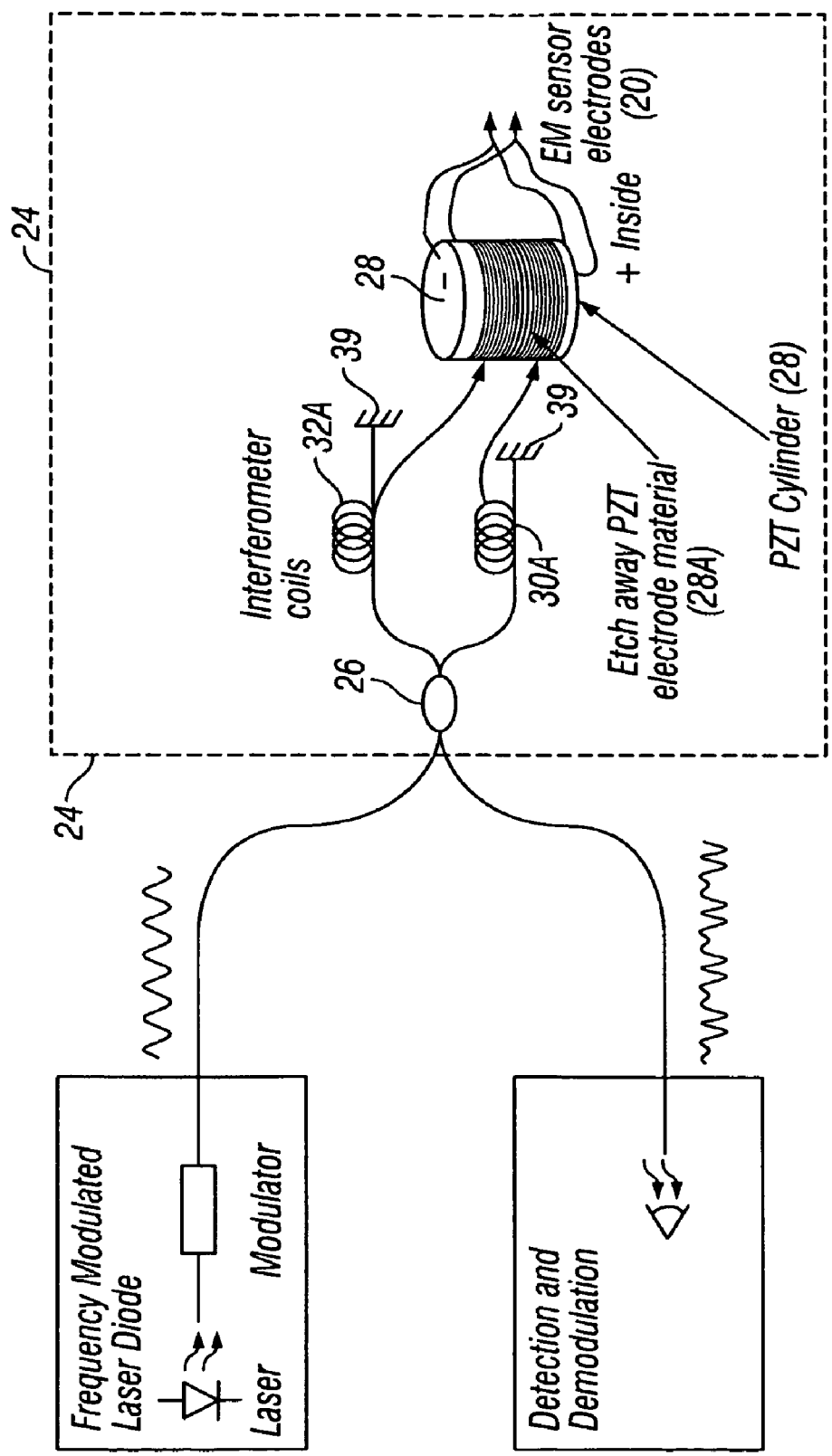
FIGS. 3 through 6 show other examples of devices that can change a length of an optical path in response to a voltage imparted across electrodes.

In FIG. 3, the converter 24 can include a cylindrically shaped piezoelectric element or crystal 28 as in the previous examples. The piezoelectric element 28 may be etched or otherwise have a feature 28A approximately in its longitudinal center that causes one longitudinal segment of the piezoelectric element 28 to operate independently of the other longitudinal segment. A first sensing fiber 30A may be wound around one longitudinal segment, and a second sensing fiber 32A may be wound around the other longitudinal segments of the piezoelectric element 28. The sensing fibers 30A, 32A may each include a mirror 39 or similar reflective surface at the terminal ends thereof, and may be coupled at the opposite ends thereof to an optical coupling as in FIG. 2A. The two longitudinal segments of the piezoelectric element or crystal 28 are electrically coupled to the electrodes (20 in FIG. 2A) in opposed polarity as shown in FIG. 3. Arranged as shown in FIG. 3, one longitudinal segment of the piezoelectric element 28 will contract in diameter and the other segment will expand in diameter when a voltage is imparted across the electrodes (20 in FIG. 2A). Therefore, one sensing fiber will increase length and the other will decrease length. When the fibers 30A, 28A change length, an interference pattern may be generated in the optical coupling 26. The arrangement shown in FIG. 3 may thus provide increased sensitivity because of the opposite change in length of each sensing fiber 30A, 28A in response to voltage imparted across the electrodes (20 in FIG. 1A). The principle of the device shown in FIG. 3 may also be implemented by using two separate piezoelectric elements electrically coupled to the electrodes in opposite polarity.

Figure 4:
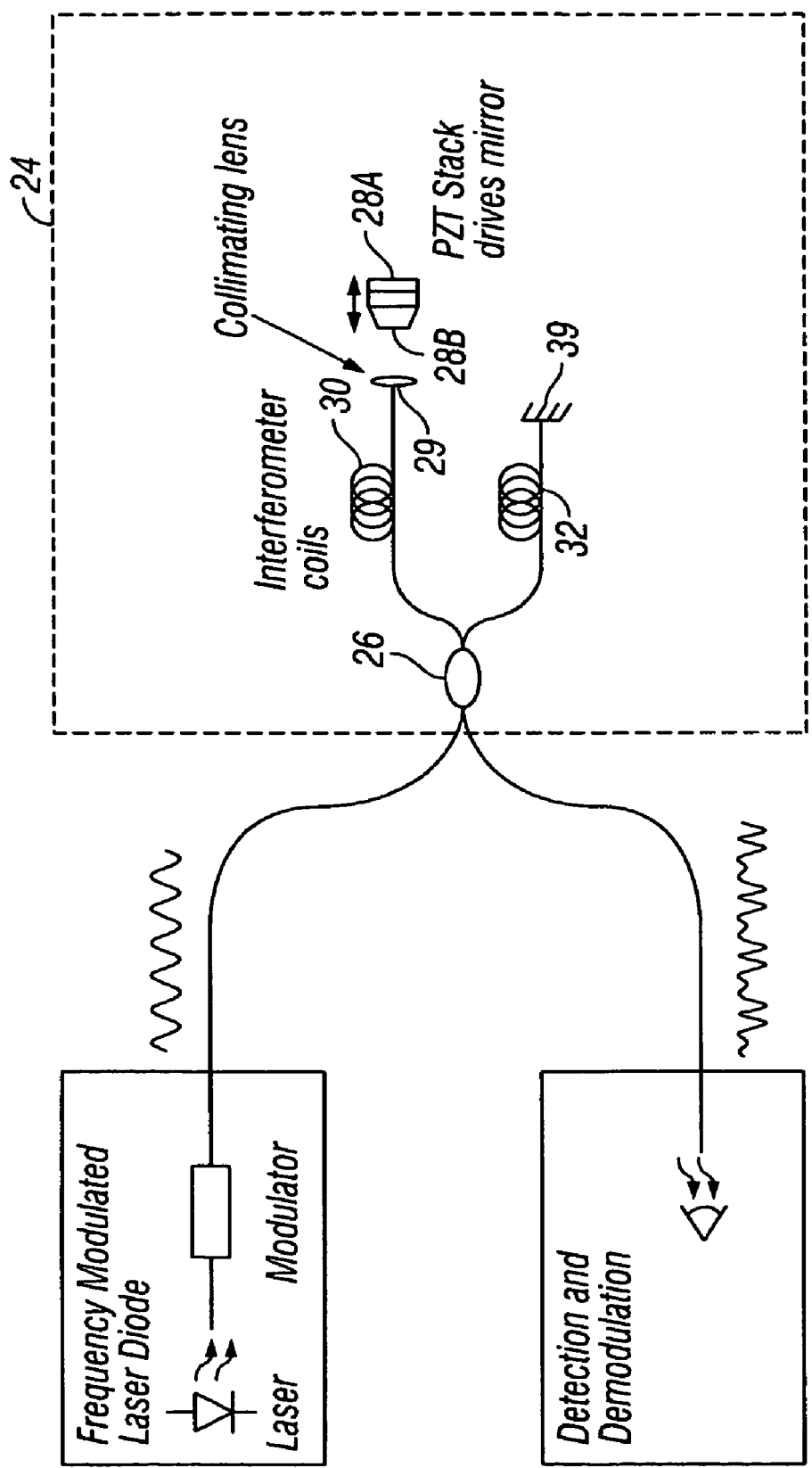

Another example shown in FIG. 4 may include a sensing fiber 30 and a reference fiber 32 as in the example of FIG. 2A. The example of FIG. 4 may include a piezoelectric element 28A including a stack of piezoelectric wafers disposed proximate the terminal end of the sensing fiber 30. A collimating lens 29 may be fixed to the end of the sensing fiber 30. One side of the piezoelectric element 28A may include a mirror 28B facing the lens 29. The piezoelectric element 28A is electrically coupled to the electrodes (20 in FIG. 2A) such that a voltage imparted across the electrodes changes the length of the piezoelectric element 28A and correspondingly changes a distance between the mirror 28B and the lens 29. Changing the foregoing distance changes the optical path length of the sensing fiber, and results in an interference pattern in an optical coupling 26, which is coupled to both the sensing fiber 30 and the reference fiber 32. The reference fiber 32 may itself include a mirror 39 at the terminal end thereof to reflect light back to the optical coupling 26 for creating the interference patter with light from the sensing fiber.

Figure 5:
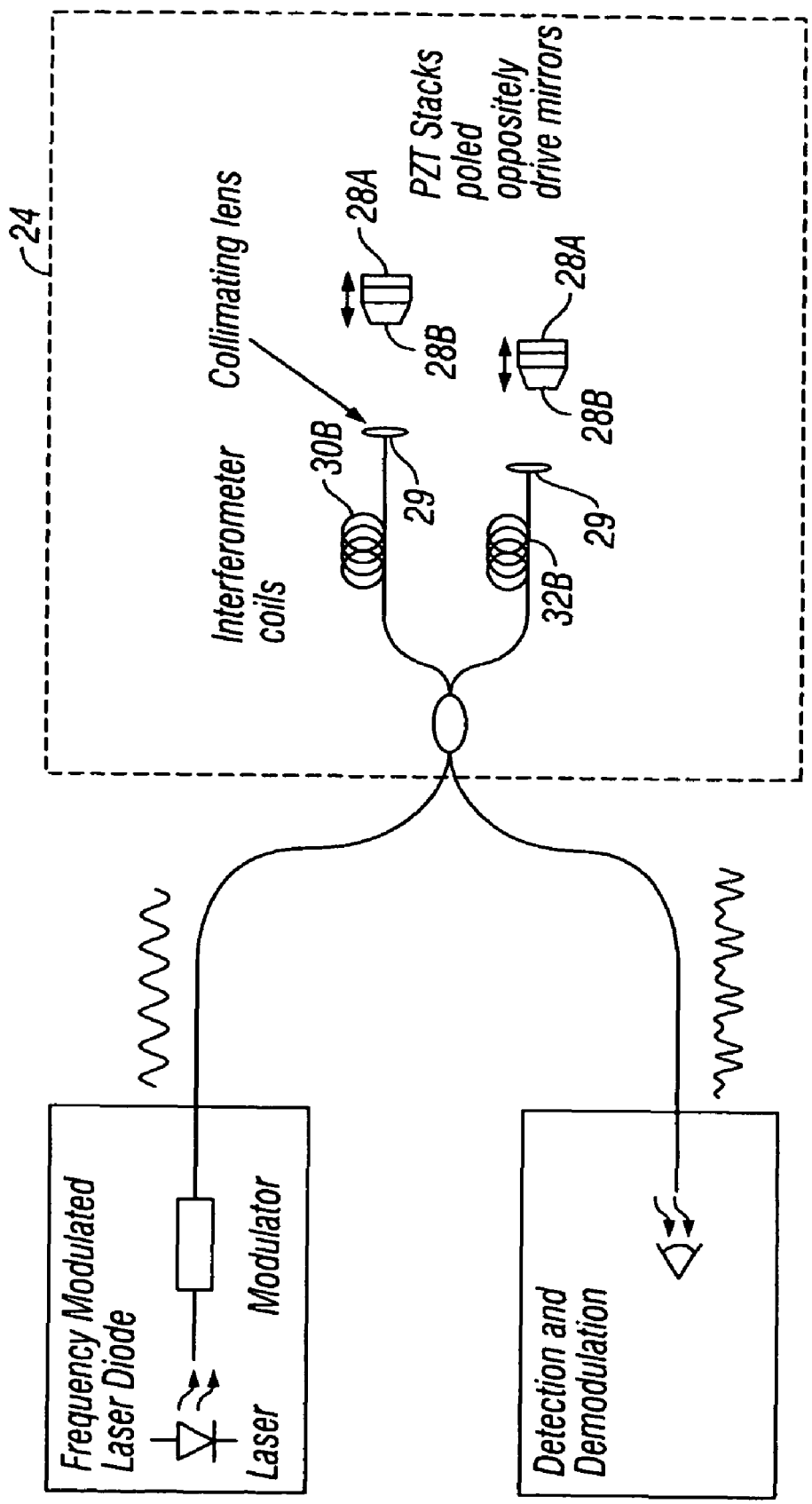

Another example of an electrical to optical converter is shown in FIG. 5 that is similar in operating principle to the example shown in FIG. 4. In the example of FIG. 5, a first sensing fiber 30B is arranged as part of an interferometer substantially as explained above with reference to FIG. 4 and is electrically coupled to the electrodes (20 in FIG. 2A) so that the element 28A changes length in response to voltage imparted across the electrodes (20 in FIG. 2A). Rather than using a reference fiber as in FIG. 4, the example of FIG. 5 includes a second sensing fiber 32B that has a collimating lens 29 at the terminal end thereof. A piezoelectric element 28A with mirror 28B thereon, similar to the piezoelectric element proximate the end of the first sensing fiber 30A, is disposed proximate the end of the second sensing fiber 32A. The piezoelectric element 28A proximate the end of the second sensing fiber is electrically coupled to the electrodes (20 in FIG. 2A) in opposed polarity to the coupling of the element 28A proximate the first sensing fiber 30A. Thus, a voltage imparted across the electrodes (20 in FIG. 2A) causes the two piezoelectric elements 28A to oppositely change length. The optical path length of the first sensing fiber 30A changes length in an opposite manner to the change in length of the second sensing fiber 32A. The arrangement shown in FIG. 5 may have increased sensitivity as compared to the arrangement shown in FIG. 4.

Figure 6:
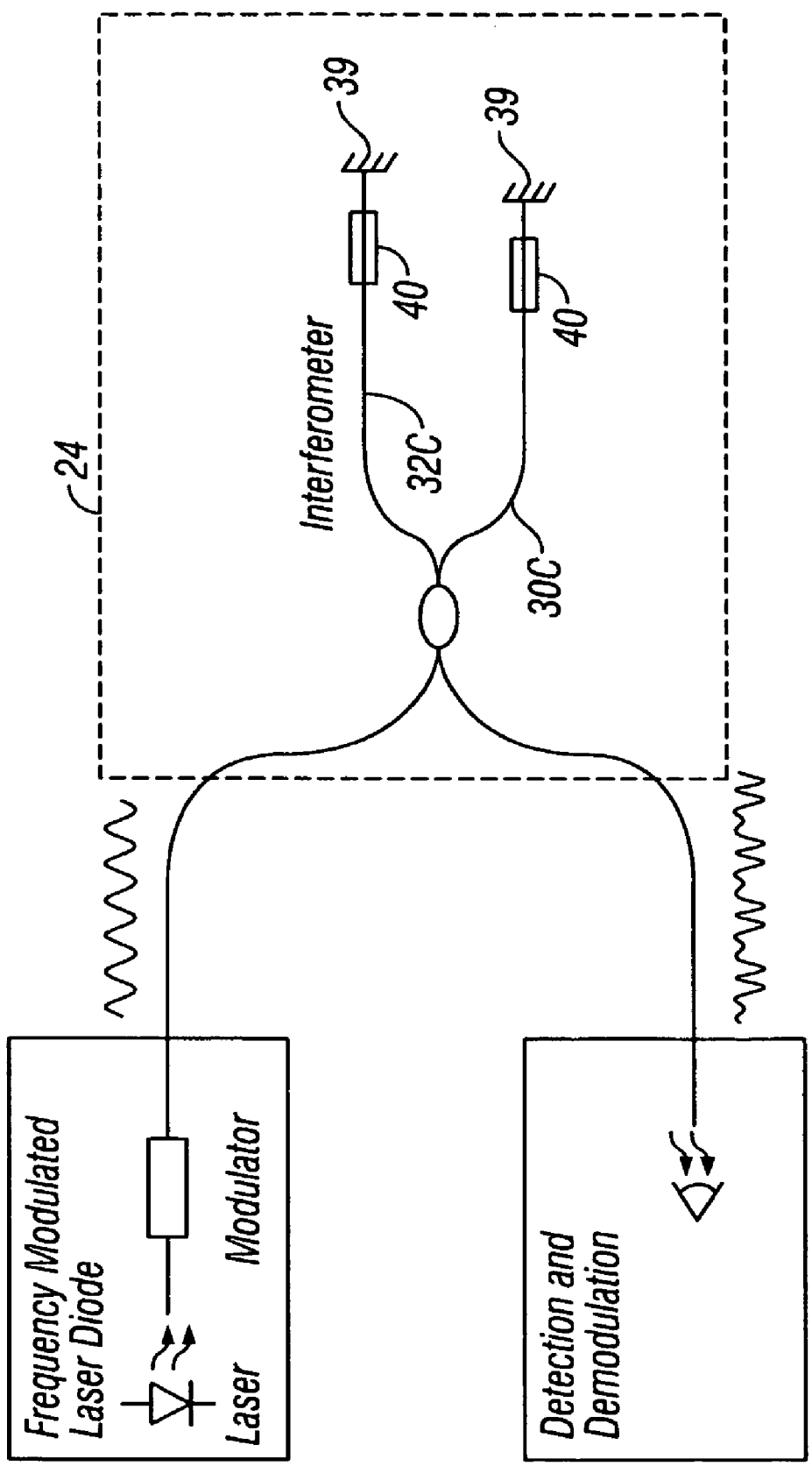

Another example of an electrical to optical converter is shown in FIG. 6. The sensing fibers 30C, 32C forming part of an optical interferometer as in the previous examples may each include a micro electromechanical sensing material, such as a lithium niobate etched into each fiber as shown at 40. Each etching has a mirror (not show separately) associated therewith. The etchings 40 may be electrically coupled proximate the ends thereof to the electrodes (20 in FIG. 2A). When voltage is imparted across the electrodes, the etchings 40 will change length, and thereby move the associated mirror. Such movement will change the optical path length of each fiber 30C, 32C so that an interference pattern may be generated in the optical coupling 26.

Figure 7A:
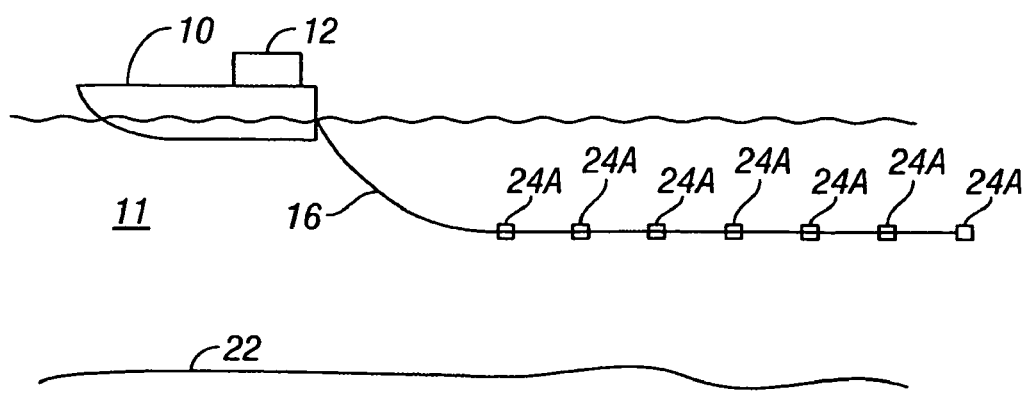
FIGS. 7A and 7B shown an example of a magnetic field sensing system using fiber optic sensors.

The foregoing examples are directed to electric field sensors that convert voltage imparted across spaced apart electrodes into a change in optical properties of light passed through an optical fiber. In other examples, described below with reference to FIG. 7A and FIG. 7B, a magnetic field resulting from imparting an electromagnetic field into the subsurface formations may be detected using a magnetostrictive sensor associated with an optical fiber. First referring to FIG. 7A, a survey system that is configured similarly to the system shown in FIG. 1A includes a survey vessel 10 including a recording system 12 thereon. The vessel 10 tows at least one electromagnetic receiver cable 16 according to the present example. The receiver cable 16 may include a plurality of spaced apart magnetostrictive sensors 24A at spaced apart positions along the receiver cable 16. An electromagnetic field source (not shown in FIG. 7A) may be towed by the vessel 10 or by another vessel (not shown).

The sensors 24A respond to changes in the amplitude of a magnetic field by changing a dimension of a magnetostrictive material. Such dimensional change causes a corresponding change in a dimension of an optical fiber.

Figure 7B:
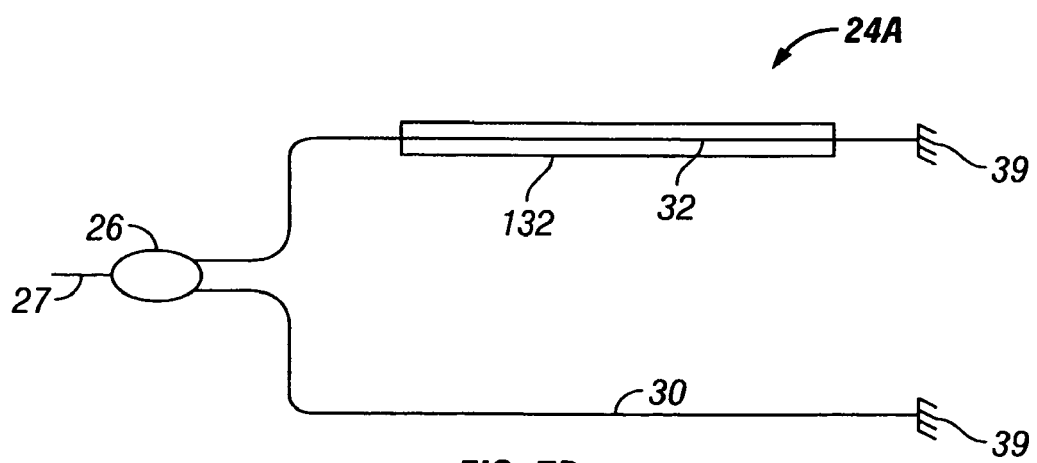

Referring to FIG. 7B, a sensing fiber 32 and a reference fiber 30 form two arms of an interferometer. Such interferometer may operate similarly to the example shown and explained with reference to FIG. 4, although such example is not a limit on the scope of this invention. The sensing fiber 32 may be coupled to a magnetostrictive material 132 such than changes in magnetic field proximate the magnetostrictive material cause change in length of the sensing fiber 32. Each of the sensing fiber 32 and the reference fiber 30 may be terminated by a mirror 39. The principle of such sensors is described, for example in U.S. Pat. No. 4,376,248 issued to Giaollrenzi et al. Other magnetostrictive transducers and sensing systems are described, for example, in U.S. Pat. Nos. 4,600,885; 4,653,915; 4,881,813; 4,889,986; 5,243,403; 5,305,075; 5,396,166; 5,491,335; 5,986,784; 6,081,633 and 6,285,806 B1.

Electromagnetic sensing devices and systems made therewith may provide measurements responsive to electric fields induced in the Earth's subsurface without the need to supply electrical power to sensing devices and/or amplification devices, and without the need for electrical signal telemetry. Such sensing devices and systems may have reduced sensitivity to electrical noise than conventional systems that transmit electrical power and signal telemetry along sensing cables.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An electromagnetic survey sensing device, comprising:
at least two electrodes disposed at spaced apart locations;
an electrical to optical converter electrically coupled to the at least two electrodes, the electrical to optical converter configured to change a property of light from a source in response to voltage imparted across the at least two electrodes;
an optical fiber optically coupled to an output of the electrical to optical converter, the optical fiber in optical communication with a detector,
wherein the electrical to optical converter comprises a means for changing an optical path length in response to the voltage imparted across the at least two electrodes, and
wherein the means for changing the optical path length comprises a first piezoelectric element electrically coupled to the at least two electrodes, a first mirror functionally associated with the first piezoelectric element and disposed proximate a first end of an optical path associated with the optical fiber, such that electrical actuation of the first piezoelectric element by the voltage causes corresponding change in distance between the end of the first optical path and the first mirror;
a second piezoelectric element electrically coupled to the at least two electrodes; and
a second mirror functionally associated with the second piezoelectric element and disposed proximate a second end of the optical path associated with the optical fiber, such that electrical actuation of the second piezoelectric element by the voltage causes corresponding change in distance between the end of the second optical path and the second mirror opposite to the change in distance between the end of the first path and the first mirror.

2. An electromagnetic survey system, comprising:
a receiver cable having an optical fiber associated therewith and coupled at one end to a recording device and at another end to at least one electrical to optical converter, the recording device including a light source and a photodetector therein in optical communication with the associated fiber;
at least two electrodes disposed at spaced apart locations along the receiver cable;
the electrical to optical converter electrically coupled to the at least two electrodes, the electrical to optical converter configured to change a property of light from the source in response to voltage imparted across the at least two electrodes;

the optical fiber optically coupled to an output of the electrical to optical converter, the optical fiber in optical communication with the detector in the recording device, wherein the at least one electrical to optical converter comprises a means for changing an optical path length in response to the voltage imparted across the at least two electrodes, and wherein the means for changing the optical path length comprises a first piezoelectric element electrically coupled to the at least two electrodes, a first mirror functionally associated with the first piezoelectric element and disposed proximate a first end of an optical path associated with the optical fiber, such that electrical actuation of the first piezoelectric element by the voltage causes corresponding change in distance between the end of the first optical path and the first mirror;

a second piezoelectric element electrically coupled to the at least two electrodes; and a second mirror functionally associated with the second piezoelectric element and disposed proximate a second end of the optical path associated with the optical fiber, such that electrical actuation of the second piezoelectric element by the voltage causes corresponding change in distance between the end of the second optical path and the second mirror opposite to the change in distance between the end of the first path and the first mirror.

3. The system of claim 2 wherein the means for changing length comprises a piezoelectric element, the piezoelectric element configured to change shape in response to voltage applied thereto from the antenna.

4. A method for sensing an electromagnetic field, comprising:

exposing an electric dipole antenna to the electromagnetic field;

conducting voltage imparted to the antenna to an electrical to a device that changes a property of light imparted thereto in response to the voltage; and changing a property of light conducted from a light source to the device and from the device to a photodetector along an optical fiber, so that a signal corresponding to the voltage is optically communicated to the photodetector, wherein the changing the property of light comprises causing a phase change therein by changing a length of an optical path between the light source and the photodetector, wherein the changing the optical path length comprises:
  moving a first mirror by one of (i) changing a dimension of a first piezoelectric element, and (ii) actuating a first piezoelectric element; and
  moving a second mirror in the opposite direction of the motion of the first mirror by one of (i) changing a dimension of a second piezoelectric element, and (ii) actuating a second piezoelectric element, and wherein each piezoelectric element is configured to change shape in response to voltage applied thereto from the antenna.

* * * * *